(12) United States Patent
Thompson et al.

(10) Patent No.: US 7,595,515 B2
(45) Date of Patent: Sep. 29, 2009

(54) METHOD OF MAKING LIGHT EMITTING DEVICE HAVING A MOLDED ENCAPSULANT

(75) Inventors: D. Scott Thompson, Woodbury, MN (US); Catherine A. Leatherdale, Woodbury, MN (US); Larry D. Boardman, Woodbury, MN (US); Andrew J. Ouderkirk, Woodbury, MN (US); Fedja Kecman, St. Louis, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 437 days.

(21) Appl. No.: 11/551,323

(22) Filed: Oct. 20, 2006

(65) Prior Publication Data

US 2007/0141739 A1 Jun. 21, 2007

Related U.S. Application Data

(60) Provisional application No. 60/729,576, filed on Oct. 24, 2005.

(51) Int. Cl.
*H01L 33/00* (2006.01)
*H01L 21/00* (2006.01)
*B32B 9/04* (2006.01)

(52) U.S. Cl. ............... 257/103; 438/26; 428/447
(58) Field of Classification Search ............... 257/103; 438/26
See application file for complete search history.

(56) References Cited

U.S. PATENT DOCUMENTS

| | | | |
|---|---|---|---|
| 2,823,218 A | 2/1958 | Speier et al. | |
| 3,159,662 A | 12/1964 | Ashby | |
| 3,220,972 A | 11/1965 | Lamoreaux | |
| 3,410,886 A | 11/1968 | Joy | |
| 3,419,593 A | 12/1968 | Willing | |
| 3,445,420 A | 5/1969 | Kookootsedes et al. | |
| 3,715,334 A | 2/1973 | Karstedt | |
| 3,814,730 A | 6/1974 | Karstedt | |
| 3,933,880 A | 1/1976 | Bergstrom et al. | |
| 3,989,666 A | 11/1976 | Niemi | |
| 3,989,667 A | 11/1976 | Lee et al. | |

(Continued)

FOREIGN PATENT DOCUMENTS

EP 0 398 573 11/1990

(Continued)

OTHER PUBLICATIONS

U.S. Ser. No. 11/255,711, filed Oct. 21, 2005, Boardman et al.

(Continued)

*Primary Examiner*—W. David Coleman
(74) *Attorney, Agent, or Firm*—Elizabeth A. Gallo (57) ABSTRACT

Disclosed herein is a method of making a light emitting device comprising an LED and a molded silicon-containing encapsulant. The method includes contacting the LED with a photopolymerizable composition containing a silicon-containing resin having silicon-bonded hydrogen and aliphatic unsaturation and two metal-containing catalysts. One catalyst may be activated by actinic radiation, and the second by heat but not the actinic radiation. Polymerization of the photopolymerizable composition to form the encapsulant may be carried out by selectively activating the different catalysts. At some point before polymerization is complete, a mold is used to impart a predetermined shape to the encapsulant.

28 Claims, 3 Drawing Sheets

U.S. PATENT DOCUMENTS

| | | |
|---|---|---|
| 4,256,870 A | 3/1981 | Eckberg |
| 4,347,346 A | 8/1982 | Eckberg |
| 4,421,903 A | 12/1983 | Ashby |
| 4,435,259 A | 3/1984 | Chang |
| 4,504,645 A | 3/1985 | Melancon |
| 4,510,094 A | 4/1985 | Drahnak |
| 4,530,879 A | 7/1985 | Drahnak |
| 4,585,669 A | 4/1986 | Eckberg |
| 4,587,137 A | 5/1986 | Eckberg |
| 4,600,484 A | 7/1986 | Drahnak |
| 4,603,215 A | 7/1986 | Chandra et al. |
| 4,609,574 A | 9/1986 | Keryk et al. |
| 4,670,531 A | 6/1987 | Eckberg |
| 4,705,765 A | 11/1987 | Lewis |
| 4,774,111 A | 9/1988 | Lo |
| 4,916,169 A | 4/1990 | Boardman et al. |
| RE33,289 E | 8/1990 | Modic |
| 5,063,102 A | 11/1991 | Lee et al. |
| 5,122,943 A | 6/1992 | Pugh |
| 5,145,886 A | 9/1992 | Oxman et al. |
| 5,213,864 A | 5/1993 | Wong |
| 5,310,581 A | 5/1994 | Schmidt et al. |
| 5,313,365 A | 5/1994 | Pennisi et al. |
| 5,403,773 A | 4/1995 | Nitta et al. |
| 5,435,953 A | 7/1995 | Osada et al. |
| 5,496,961 A | 3/1996 | Dauth et al. |
| 5,507,633 A | 4/1996 | Osada et al. |
| 5,523,436 A | 6/1996 | Dauth et al. |
| 5,525,564 A | 6/1996 | McAfee et al. |
| 5,603,879 A | 2/1997 | Osada et al. |
| 5,639,845 A | 6/1997 | Inomata et al. |
| 5,753,538 A | 5/1998 | Kuno et al. |
| 5,777,433 A | 7/1998 | Lester |
| 5,834,035 A | 11/1998 | Osada et al. |
| 5,895,228 A | 4/1999 | Biebuyck et al. |
| 5,952,397 A | 9/1999 | Fujiki et al. |
| 6,046,250 A | 4/2000 | Boardman et al. |
| 6,099,783 A | 8/2000 | Scranton et al. |
| 6,114,090 A | 9/2000 | Wu et al. |
| 6,150,546 A | 11/2000 | Butts |
| 6,319,425 B1 | 11/2001 | Tasaki et al. |
| 6,376,569 B1 | 4/2002 | Oxman et al. |
| 6,451,869 B1 | 9/2002 | Butts |
| 6,598,998 B2 | 7/2003 | West et al. |
| 6,600,175 B1 | 7/2003 | Baretz et al. |
| 6,653,157 B2 | 11/2003 | Kondo |
| 6,664,318 B1 | 12/2003 | Bymark et al. |
| 6,679,621 B2 | 1/2004 | West et al. |
| 6,682,331 B1 | 1/2004 | Peh et al. |
| 6,740,465 B2 | 5/2004 | Liang et al. |
| 6,756,731 B1 | 6/2004 | Sano |
| 6,806,509 B2 | 10/2004 | Yoshino |
| 6,806,658 B2 | 10/2004 | Tan |
| 6,921,929 B2 | 7/2005 | LeBoeuf et al. |
| 6,958,250 B2 | 10/2005 | Yang |
| 6,977,188 B2 | 12/2005 | Takase |
| 7,192,795 B2 | 3/2007 | Boardman et al. |
| 7,256,428 B2 | 8/2007 | Braune et al. |
| 2001/0026011 A1 | 10/2001 | Roberts et al. |
| 2002/0030194 A1 | 3/2002 | Camras et al. |
| 2002/0141006 A1 | 10/2002 | Pocius et al. |
| 2003/0115907 A1 | 6/2003 | Patton et al. |
| 2004/0036081 A1 | 2/2004 | Okazaki |
| 2004/0053059 A1 | 3/2004 | Mistele |
| 2004/0116640 A1 | 6/2004 | Miyoshi |
| 2004/0145913 A1 | 7/2004 | Ouderkirk et al. |
| 2004/0150991 A1 | 8/2004 | Ouderkirk et al. |
| 2004/0227149 A1 | 11/2004 | Ibbetson et al. |
| 2004/0245541 A1 | 12/2004 | Shitagaki et al. |
| 2005/0162733 A1 | 7/2005 | Cho et al. |
| 2005/0244649 A1 | 11/2005 | Kashiwagi |
| 2006/0035092 A1 | 2/2006 | Shimizu et al. |
| 2006/0091418 A1 | 5/2006 | Chew |
| 2006/0105480 A1 | 5/2006 | Boardman et al. |
| 2006/0105481 A1 | 5/2006 | Boardman et al. |
| 2006/0105484 A1 | 5/2006 | Basin et al. |
| 2006/0105485 A1 | 5/2006 | Basin et al. |
| 2006/0157875 A1 | 7/2006 | Van Santen et al. |
| 2006/0186428 A1 | 8/2006 | Tan et al. |
| 2006/0226774 A1 | 10/2006 | Sofue et al. |
| 2007/0092636 A1 | 4/2007 | Thompson et al. |
| 2007/0112147 A1 | 5/2007 | Morita et al. |
| 2007/0134425 A1 | 6/2007 | Morita et al. |

FOREIGN PATENT DOCUMENTS

| | | |
|---|---|---|
| EP | 1 198 016 | 4/2002 |
| EP | 1 424 363 | 6/2004 |
| JP | 05-19705 | 1/1993 |
| JP | 2002-232018 | 8/2002 |
| KR | 2004-0086871 | 10/2004 |
| WO | 95/025735 | 9/1995 |

OTHER PUBLICATIONS

U.S. Ser. No. 11/255,712, filed Oct. 21, 2005, Boardman et al.

METHOD OF MAKING LIGHT EMITTING DEVICE HAVING A MOLDED ENCAPSULANT

CROSS REFERENCE TO RELATED APPLICATIONS

This application claims the benefit of U.S. Provisional Patent Application No. 60/729,576, filed Oct. 24, 2005, the disclosure of which is incorporated by reference herein in its entirety.

FIELD OF THE INVENTION

The invention relates to a method of making a light emitting device having an LED die and an encapsulant, wherein the encapsulant is molded and comprises a silicon-containing resin.

BACKGROUND

Encapsulation of semiconductor devices has traditionally been accomplished using a transfer molding process in which a thermoset molding compound (typically a solid epoxy preform) is dielectrically preheated and then placed into a pot of a molding tool. A transfer cylinder, or plunger, is used to push the molding compound into a runner system and gates of the mold. The molding compound then flows over the chips, wirebonds, and leadframes, encapsulating the semiconductor device. Most transfer molding processes suffer from significant problems arising from high operating temperatures (the molding compound is a solid at room temperature) and high pressures required to fill the mold (even in the melt state, the molding compound has a high viscosity, and the viscosity increases further with reaction). These problems can lead to incomplete mold filling, thermal stresses (since the reaction temperature is much higher than the final use temperature), and wire sweep.

SUMMARY

Disclosed herein is a method of making an encapsulated LED with a molded silicon-containing encapsulant at low temperature using low to moderate viscosity resins. The method avoids problems associated with wire sweep as described above.

The method disclosed herein is for making a light emitting device, the method comprising the following: providing an LED; contacting the LED with a photopolymerizable composition comprising a silicon-containing resin comprising silicon-bonded hydrogen and aliphatic unsaturation, a first metal-containing catalyst that may be activated by actinic radiation, and a second metal-containing catalyst that may be activated by heat but not the actinic radiation; and contacting the photopolymerizable composition with a mold. After contacting with the mold, actinic radiation may be applied to the photopolymerizable composition, wherein the actinic radiation is at a wavelength of 700 nm or less and initiates hydrosilylation within the silicon-containing resin, the hydrosilylation comprising reaction between the silicon-bonded hydrogen and the aliphatic unsaturation. The actinic radiation may be used to form a partially polymerized composition, such that the method may further comprise heating to further initiate hydrosilylation within the silicon-containing resin. Alternatively, after contacting with the mold, hydrosilylation may be initiated by heating the photopolymerizable composition to a temperature of less than about 150° C.

The method may also comprise applying actinic radiation to the photopolymerized composition before contacting with the mold in order to form a partially polymerized composition. Then, after contacting with the mold, actinic radiation could be applied to the partially polymerized composition such that hydrosilylation is further initiated within the silicon-containing resin and a second partially polymerized composition is formed. Alternately, hydrosilylation may be further initiated by heating the partially polymerized composition to a temperature of less than about 150° C.

The method may also comprise applying heating the partially polymerized composition to a temperature of less than about 150° C. before contacting with the mold in order to form a partially polymerized composition. Then, after contacting with the mold, actinic radiation could be applied to the partially polymerized composition such that hydrosilylation is further initiated within the silicon-containing resin and a second partially polymerized composition is formed. Alternately, hydrosilylation may be further initiated by heating the partially polymerized composition to a temperature of less than about 150° C.

The mold may be shaped to impart any useful structure, for example, a positive or negative lens, or some combination of macrostructures and/or microstructures.

These and other aspects of the invention will be apparent from the detailed description and drawings below. In no event should the above summary be construed as a limitation on the claimed subject matter, which subject matter is defined solely by the attached claims, as may be amended during prosecution.

The invention may be more completely understood in consideration of the following detailed description in connection with the Figures described above. The Figures are illustrative examples only.

DETAILED DESCRIPTION

This application is related to U.S. patent application Ser. No. 11/551309 by Thompson et al., entitled Method of Making Light Emitting Device Having a Molded Encapsulant", and filed of even date herewith. This application is also related to: commonly assigned, co-pending U.S. patent application Ser. No. 11/255711 by Boardman et al., entitled "Method of Making Light Emitting Device with Silicon-Containing Encapsulant", filed Oct. 21, 2005, which claims priority from U.S. Provisional Application Ser. No. 60/727472 by Boardman et al., entitled "Method of Making Light Emitting Device with Silicon-Containing Encapsulant", filed Oct. 17, 2005; commonly assigned, co-pending U.S. patent application Ser. No. 11/255712 by Boardman et al., entitled "Method of Making Light Emitting Device with Silicon-Containing Encapsulant", filed Oct. 21, 2005, which claims priority from U.S. Provisional Application Ser. No. 60/727532 by Boardman et al., entitled "Method of Making Light Emitting Device with Silicon-Containing Encapsulant", filed Oct. 17, 2005; and commonly assigned, co-pending U.S. patent application Ser. No. 11/252336 by Boardman et al., entitled "Method of Making Light Emitting Device with Silicon-Containing Encapsulant", and filed Oct. 17, 2005, which is a continuation-in-part of U.S. patent application Ser. No. 10/993,460, filed Nov. 18, 2004, now allowed; the disclosures of which are incorporated by reference herein in their entirety.

The method described herein employs a mold that comprises a mold material and can be shaped so as to impart a desired complimentary shape to the outer surface of the encapsulant. As used herein, "encapsulant" refers to an at least partially polymerized silicon-containing resin. Any material capable of being formed into a mold may be used, and in general, it is usually desirable for the mold material to have a glass transition temperature greater than the particular temperature(s) used in a method of making the light emitting device as described below. Examples of mold materials include polymeric materials such as fluoroelastomers, polyolefins, polystyrene, polyesters, polyurethanes, polyethers, polycarbonates, polymethyl methacrylate; and inorganic materials comprising ceramics, quartz, sapphire, metals, and certain glasses. Even organic-inorganic hybrid materials may be used as the mold; exemplary hybrid materials include fluorinated materials described by Choi et al. in *Langmuir*, Vol. 21, page 9390 (2005). The mold may be transparent such as a transparent ceramic; a transparent mold would be useful in cases where the actinic radiation is applied through the mold. The mold can also be non-transparent such as an opaque ceramic, an opaque plastic, or a metal. The mold can be fabricated by conventional machining, diamond turning, contact lithography, projection lithography, interference lithography, etching, or any other suitable technique. The mold may be an original master mold or a daughter mold thereof. Molding may be referred to as reactive embossing.

The surface of the mold that contacts the photopolymerizable composition, or the partially polymerized composition, may be coated with a release material in order to facilitate removal of the mold from the surface that has been molded. For example, with a steel or nickel mold, it may be useful to spray the molding surface with a 2 to 5 weight percent solution of a household detergent in water every 5 to 10 cycles. Fluorocarbon release agents can also be used. One light emitting device or a plurality of light emitting devices may be fabricated simultaneously using a single mold.

The mold may be shaped so as to impart any useful structure on the surface of the photopolymerizable composition or the partially polymerized composition. For example, the mold may be shaped so as to form a refractive lens on the LED. Lensing refers to the uniform (or nearly uniform) curvature of a substantial portion of the surface of the encapsulant to form a positive or negative lens, the diameter of which is approximately the size of the package or reflector cup. In general, a lensed surface can be characterized by a "radius of curvature." The radius of curvature can be either positive, denoting a convex surface or negative denoting a concave surface or infinite denoting a flat surface. Lensing can improve light extraction by reducing the total internal reflections of light incident at the encapsulant-air interface. It can also change the angular distribution of light emitted from the light emitting device.

Figure 1:
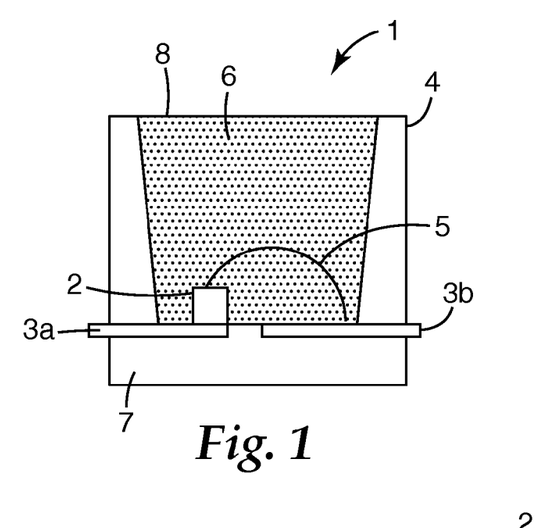
FIG. 1 shows a schematic cross sectional view of an exemplary light emitting device having an unmolded encapsulant.
Figure 2:
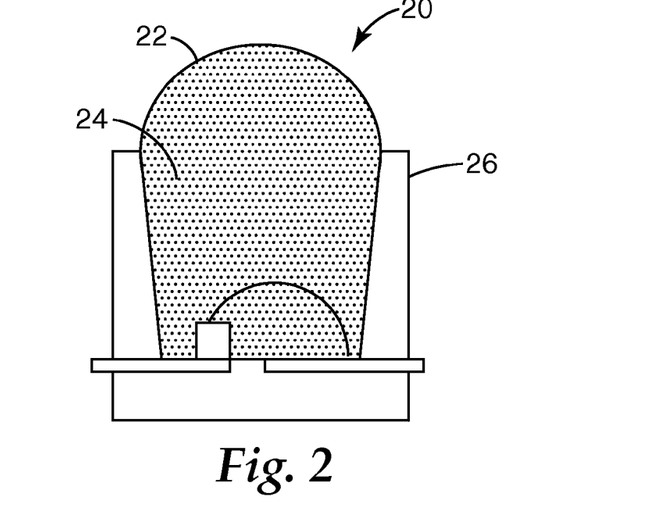
FIGS. 2-8 show views of exemplary light emitting devices wherein the encapsulant is molded.
Figure 3:
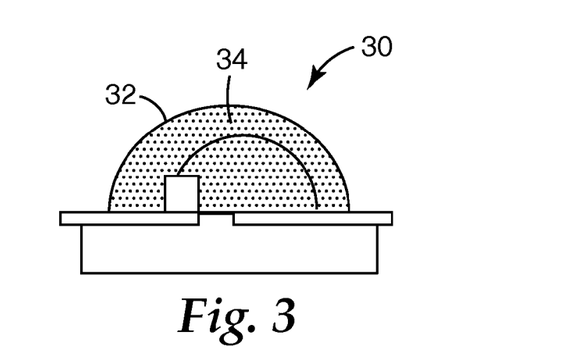

Referring to FIG. 1, light emitting device 10 comprising an unmolded encapsulant 6 is shown. LED 2 is mounted on a metallized contact 3*a* disposed on a substrate 7 in a reflector cup 4. LED 2 has one electrical contact on its lowermost surface and another on its uppermost surface, the latter of which is connected to a separate electrical contact 3*b* by a wire bond 5. A power source can be coupled to the electrical contacts to energize the LED. Surface 8 of encapsulant 6 is not molded. FIG. 2 shows a schematic cross-sectional view of exemplary light emitting device 20 in which surface 22 of encapsulant 24 is molded in the shape of a hemispherical lens approximately the size of the reflector cup 26. FIG. 3 shows a schematic cross-sectional view of another exemplary light emitting device 30, except that the device does not have a reflector cup. In this case, surface 32 of encapsulant 34 is also molded in the shape of a hemispherical lens.

The surface may also be shaped with macrostructures having a characteristic dimension that is smaller than the package size, but much larger than the wavelength of visible light. That is, each macrostructure may have a dimension of from 10 μm to 1 mm. The spacing or period between each macrostructure may also be from 10 μm to 1 mm (or about ⅓ the size of the LED package). Examples of macrostructures include surfaces that, when viewed in cross-section, appear to be shaped like a sine wave, triangular wave, square wave, rectified sine wave, saw tooth wave, cycloid (more generally curtate cycloid), or rippled. The periodicity of the macrostructures may be one- or two-dimensional. Surfaces with one-dimensional periodicity have repeat structures along only one major direction of the surface. In one particular example, the mold may comprise any of the Vikuiti™ Brightness Enhancement Films available from 3M Company.

The mold may be shaped to impart a lens structure capable of making a molded encapsulant that can generate a side-emission pattern. For example, the molded encapsulant has a central axis, and light entering the molded encapsulant is reflected and refracted and eventually exits in a direction substantially perpendicular to the central axis; examples of these types of side emitting lens shapes and devices are described in U.S. Pat. No. 6,679,621 B2 and U.S. Pat. No. 6,598,998 B2. For another example, the molded encapsulant has a generally planar surface, with a smoothly curved surface defining a vortex shape that extends into the encapsulant and has the shape of an equiangular spiral that forms into a cusp; an example of such a profile is described in U.S. Pat. No. 6,473,554 B1, particularly FIGS. 15, 16 and 16A.

Figure 4:
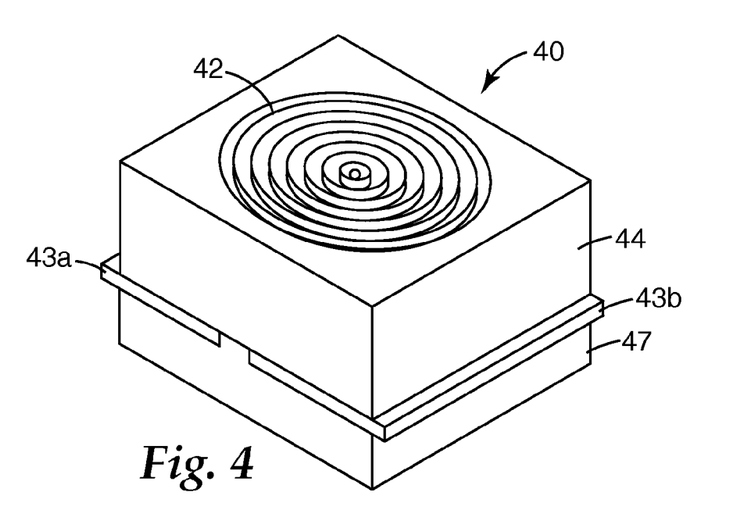

Surfaces with two-dimensional periodicity have repeat structures along any two orthogonal directions in the plane of the macrostructures. Examples of macrostructures with two-dimensional periodicity include random surfaces, two-dimensional sinusoids, arrays of cones, arrays of prisms such as cube-corners, and lenslet arrays. FIG. 4 shows an elevated view of another exemplary light emitting device 40 wherein surface 42 of the encapsulant is shaped as a Fresnal lens having generally circular symmetry and that can be designed to replicate the optical properties of any positive or negative lens while occupying much less volume than a solid lens. Also shown in FIG. 4 are metallized contacts 43*a* and 43*b* disposed on a substrate 47 in a reflector cup 44 (the LED and wire bond are not visible).

In general, the macrostructures do not need to be uniform in size across the surface. For example, they may get larger or smaller toward the edges of the package, or they may change shape. The surface may consist of any linear combination of shapes described herein.

Figure 5:
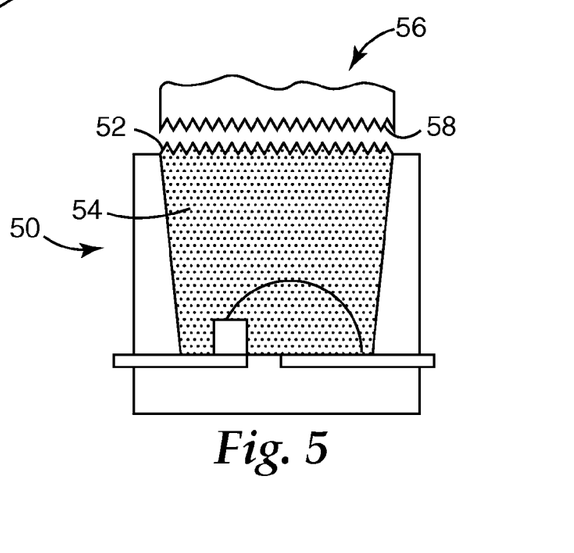
Figure 6:
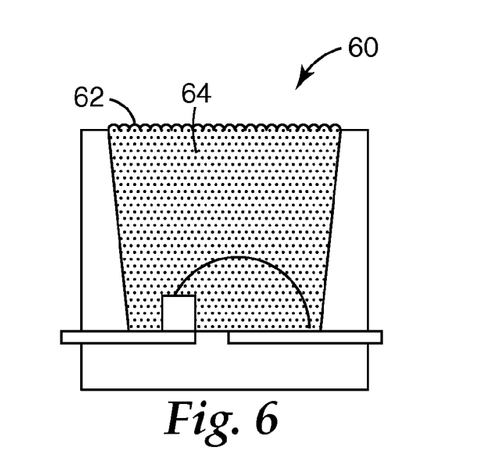
Figure 7:
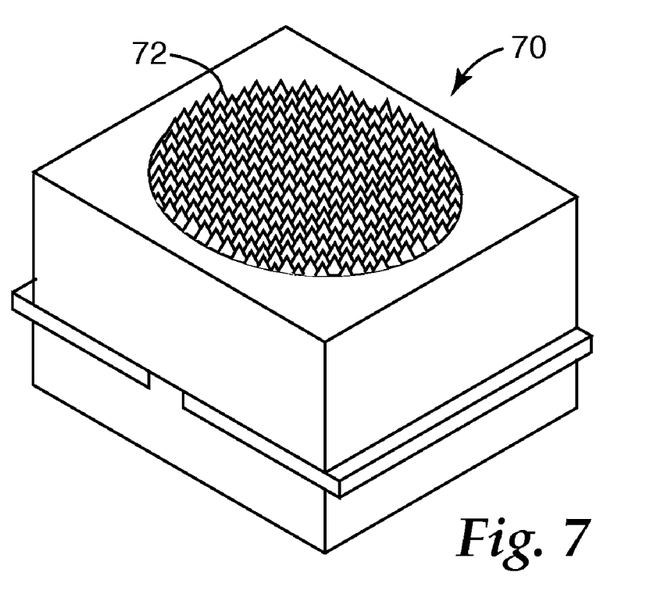

The surface may also be shaped with microstructures having a characteristic dimension on a scale similar to the wavelengths of visible light. That is, each microstructure may have a dimension of from 100 nm to less than 10 μm. Light tends to diffract when it interacts with microstructured surfaces. Thus, the design of microstructured surfaces requires careful attention to the wave-like nature of light. Examples of microstructures are one- and two-dimensional diffraction gratings; one-, two-, or three-dimensional photonic crystals; binary optical elements; and "motheye" anti-reflection coatings. FIG. 5 shows a schematic cross-sectional view of exemplary light emitting device 50 wherein the surface 52 of encapsulant 54 is molded with linear prisms having one-dimensional periodicity. Mold 56 having surface 58 with a complimentary shape is also shown. FIG. 7 shows an elevated view of another exemplary light emitting device 70, wherein surface 72 of the encapsulant comprises an array of two-dimensional prisms. In FIG. 6, a schematic cross-sectional view of another exemplary light emitting device 60 is shown wherein surface 62 of encapsulant 64 is molded with microlenses.

Figure 8:
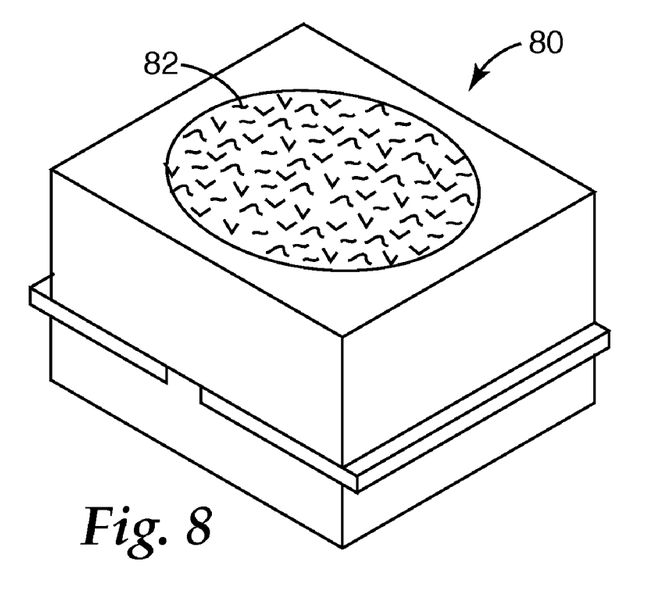

The microstructures do not need to be uniform in size across the surface. For example, the elements may get larger or smaller toward the edges of the package, or they may change shape. The surface may consist of any linear combination of shapes described herein. FIG. 8 shows an elevated view of another exemplary light emitting device 80, wherein surface 82 of the encapsulant comprises randomly disposed protrusions and depressions.

The surface of the encapsulant may comprise structures from all three size scales. All package surfaces will be lensed with some radius of curvature, which could be positive, negative, or infinite. A macrostructure or microstructure could be added to the lensed surface to further enhance light output or to optimize the angular distribution for a given application. A surface could even incorporate a microstructure on a macrostructure on a lensed surface.

The method described herein also includes providing a photopolymerizable composition comprising a silicon-containing resin comprising silicon-bonded hydrogen and aliphatic unsaturation. The silicon-containing resin can include monomers, oligomers, polymers, or mixtures thereof. It includes silicon-bonded hydrogen and aliphatic unsaturation, which allows for hydrosilylation (i.e., the addition of a silicon-bonded hydrogen across a carbon-carbon double bond or triple bond). The silicon-bonded hydrogen and the aliphatic unsaturation may or may not be present in the same molecule. Furthermore, the aliphatic unsaturation may or may not be directly bonded to silicon.

Preferred silicon-containing resins are those that provide an encapsulant, which can be in the form of a liquid, gel, elastomer, or a non-elastic solid, and are thermally and photochemically stable. For UV light, silicon-containing resins having refractive indices of at least 1.34 are preferred. For some embodiments, silicon-containing resins having refractive indices of at least 1.50 are preferred.

Preferred silicon-containing resins are selected such that they provide an encapsulant that is photostable and thermally stable. Herein, photostable refers to a material that does not chemically degrade upon prolonged exposure to actinic radiation, particularly with respect to the formation of colored or light absorbing degradation products. Herein, thermally stable refers to a material that does not chemically degrade upon prolonged exposure to heat, particularly with respect to the formation of colored or light absorbing degradation products. In addition, preferred silicon-containing resins are those that possess relatively rapid cure mechanisms (e.g., seconds to less than 30 minutes) in order to accelerate manufacturing times and reduce overall LED cost.

Examples of suitable silicon-containing resins are disclosed, for example, in U.S. Pat. No. 6,376,569 (Oxman et al.), U.S. Pat. No. 4,916,169 (Boardman et al.), U.S. Pat. No. 6,046,250 (Boardman et al.), U.S. Pat. No. 5,145,886 (Oxman et al.), U.S. Pat. No. 6,150,546 (Butts), and in U.S. Pat. Appl. Nos. 2004/0116640 (Miyoshi). A preferred silicon-containing resin comprises an organosiloxane (i.e., silicones), which includes organopolysiloxanes. Such resins typically include at least two components, one having silicon-bonded hydrogen and one having aliphatic unsaturation. However, both silicon-bonded hydrogen and olefinic unsaturation may exist within the same molecule.

In one embodiment, the silicon-containing resin can include a silicone component having at least two sites of aliphatic unsaturation (e.g., alkenyl or alkynyl groups) bonded to silicon atoms in a molecule and an organohydrogensilane and/or organohydrogenpolysiloxane component having at least two hydrogen atoms bonded to silicon atoms in a molecule. Preferably, a silicon-containing resin includes both components, with the silicone containing aliphatic unsaturation as the base polymer (i.e., the major organosiloxane component in the composition.) Preferred silicon-containing resins are organopolysiloxanes. Such resins typically comprise at least two components, at least one of which contains aliphatic unsaturation and at least one of which contains silicon-bonded hydrogen. Such organopolysiloxanes are known in the art and are disclosed in such patents as U.S. Pat. No. 3,159,662 (Ashby), U.S. Pat. No. 3,220,972 (Lamoreauz), U.S. Pat. No. 3,410,886 (Joy), U.S. Pat. No. 4,609,574 (Keryk), U.S. Pat. No. 5,145,886 (Oxman, et. al), and U.S. Pat. No. 4,916,169 (Boardman et. al). Curable one component organopolysiloxane resins are possible if the single resin component contains both aliphatic unsaturation and silicon-bonded hydrogen.

Organopolysiloxanes that contain aliphatic unsaturation are preferably linear, cyclic, or branched organopolysiloxanes comprising units of the formula $R^1_a R^2_b SiO_{(4-a-b)/2}$ wherein: $R^1$ is a monovalent, straight-chained, branched or cyclic, unsubstituted or substituted hydrocarbon group that is free of aliphatic unsaturation and has from 1 to 18 carbon atoms; $R^2$ is a monovalent hydrocarbon group having aliphatic unsaturation and from 2 to 10 carbon atoms; a is 0, 1, 2, or 3; b is 0, 1, 2, or 3; and the sum a+b is 0, 1, 2, or 3; with the proviso that there is on average at least 1 $R^2$ present per molecule.

Organopolysiloxanes that contain aliphatic unsaturation preferably have an average viscosity of at least 5 mPa·s at 25° C.

Examples of suitable $R^1$ groups are alkyl groups such as methyl, ethyl, n-propyl, iso-propyl, n-butyl, iso-butyl, tert-butyl, n-pentyl, iso-pentyl, neo-pentyl, tert-pentyl, cyclopentyl, n-hexyl, cyclohexyl, n-octyl, 2,2,4-trimethylpentyl, n-decyl, n-dodecyl, and n-octadecyl; aromatic groups such as phenyl or naphthyl; alkaryl groups such as 4-tolyl; aralkyl groups such as benzyl, 1-phenylethyl, and 2-phenylethyl; and substituted alkyl groups such as 3,3,3-trifluoro-n-propyl, 1,1,2,2-tetrahydroperfluoro-n-hexyl, and 3-chloro-n-propyl.

Examples of suitable $R^2$ groups are alkenyl groups such as vinyl, 5-hexenyl, 1-propenyl, allyl, 3-butenyl, 4-pentenyl, 7-octenyl, and 9-decenyl; and alkynyl groups such as ethynyl, propargyl and 1-propynyl. In the present invention, groups having aliphatic carbon-carbon multiple bonds include groups having cycloaliphatic carbon-carbon multiple bonds.

Organopolysiloxanes that contain silicon-bonded hydrogen are preferably linear, cyclic or branched organopolysiloxanes comprising units of the formula $R^1_a H_c SiO_{(4-a-c)/2}$ wherein: $R^1$ is as defined above; a is 0, 1, 2, or 3; c is 0, 1, or 2; and the sum of a+c is 0, 1, 2, or 3; with the proviso that there is on average at least 1 silicon-bonded hydrogen atom present per molecule.

Organopolysiloxanes that contain silicon-bonded hydrogen preferably have an average viscosity of at least 5 mPa·s at 25° C.

Organopolysiloxanes that contain both aliphatic unsaturation and silicon-bonded hydrogen preferably comprise units of both formulae $R^1_a R^2_b SiO_{(4-a-b)/2}$ and $R^1_a H_c SiO_{(4-a-c)/2}$. In these formulae, $R^1$, $R^2$, a, b, and c are as defined above, with the proviso that there is an average of at least 1 group containing aliphatic unsaturation and 1 silicon-bonded hydrogen atom per molecule.

The molar ratio of silicon-bonded hydrogen atoms to aliphatic unsaturation in the silicon-containing resin (particularly the organopolysiloxane resin) may range from 0.5 to 10.0 mol/mol, preferably from 0.8 to 4.0 mol/mol, and more preferably from 1.0 to 3.0 mol/mol.

For some embodiments, organopolysiloxane resins described above wherein a significant fraction of the $R^1$ groups are phenyl or other aryl, aralkyl, or alkaryl are preferred, because the incorporation of these groups provides materials having higher refractive indices than materials wherein all of the $R^1$ radicals are, for example, methyl.

The disclosed compositions also include first and second metal-containing catalysts. These catalysts are known in the art and typically include complexes of precious metals such as platinum, rhodium, iridium, cobalt, nickel, and palladium. The first and/or second metal-containing catalysts may comprise platinum. Two or more of the first and/or second metal-containing catalysts may be used.

A variety of first metal-containing catalysts is disclosed, for example, in U.S. Pat. No. 6,376,569 (Oxman et al.), U.S. Pat. No. 4,916,169 (Boardman et al.), U.S. Pat. No. 6,046,250 (Boardman et al.), U.S. Pat. No. 5,145,886 (Oxman et al.), U.S. Pat. No. 6,150,546 (Butts), U.S. Pat. No. 4,530,879 (Drahnak), U.S. Pat. No. 4,510,094 (Drahnak), U.S. Pat. No. 5,496,961 (Dauth), U.S. Pat. No. 5,523,436 (Dauth), U.S. Pat. No. 4,670,531 (Eckberg), as well as International Publication No. WO 95/025735 (Mignani).

The first metal-containing catalyst may be selected from the group consisting of Pt(II) β-diketonate complexes (such as those disclosed in U.S. Pat. No. 5,145,886 (Oxman et al.), ($\eta^5$-cyclopentadienyl)tri(σ-aliphatic)platinum complexes (such as those disclosed in U.S. Pat. No. 4,916,169 (Boardman et al.) and U.S. Pat. No. 4,510,094 (Drahnak)), and $C_{7\text{-}20}$-aromatic substituted ($\eta^5$-cyclopentadienyl)tri(σ-aliphatic)platinum complexes (such as those disclosed in U.S. Pat. No. 6,150,546 (Butts).

A variety of second metal-containing catalysts is disclosed, for example, in U.S. Pat. No. 2,823,218 (Speier et al), U.S. Pat. No. 3,419,593 (Willing), U.S. Pat. Nos. 3,715,334 and 3,814,730 (Karstedt), U.S. Pat. No. 4,421,903 (Ashby), U.S. Pat. No. 3,220,972 (Lamoreaux), U.S. Pat. No. 4,613,215 (Chandra et al), and U.S. Pat. No. 4,705,765 (Lewis). In some embodiments, the second metal-containing catalyst comprises a platinum vinylsiloxane complex.

The amounts of first and second metal-containing catalysts used in the photopolymerizable composition may depend on a variety of factors such as whether actinic radiation and/or heat is being used, the radiation source, amount of time, temperature, etc., as well as on the particular chemistry of the silicon-containing resin, its reactivity, the amount present in the light emitting device, etc. The first and second metal-containing catalysts may be independently used in an amount of at least 1 part, and more preferably at least 5 parts, per one million parts of the photopolymerizable composition. Such catalysts are preferably included in the photopolymerizable composition in an amount of no greater than 1000 parts of metal, and more preferably no greater than 200 parts of metal, per one million parts of the photopolymerizable composition.

In addition to the silicon-containing resins and catalysts, the photopolymerizable composition can also include nonabsorbing metal oxide particles, semiconductor particles, phosphors, sensitizers, photoinitiators, antioxidants, catalyst inhibitors, and pigments. If used, such additives are used in amounts to produced the desired effect.

Particles that are included within the photopolymerizable composition can be surface treated to improve dispersibility of the particles in the resin. Examples of such surface treatment chemistries include silanes, siloxanes, carboxylic acids, phosphonic acids, zirconates, titanates, and the like. Techniques for applying such surface treatment chemistries are known.

Nonabsorbing metal oxide and semiconductor particles can optionally be included in the photopolymerizable composition to increase the refractive index of the encapsulant. Suitable nonabsorbing particles are those that are substantially transparent over the emission bandwidth of the LED. Examples of nonabsorbing metal oxide and semiconductor particles include, but are not limited to, $Al_2O_3$, $ZrO_2$, $TiO_2$, $V_2O_5$, ZnO, $SnO_2$, ZnS, $SiO_2$, and mixtures thereof, as well as other sufficiently transparent non-oxide ceramic materials such as semiconductor materials including such materials as ZnS, CdS, and GaN. Silica ($SiO_2$), having a relatively low refractive index, may also be useful as a particle material in some applications, but, more significantly, it can also be useful as a thin surface treatment for particles made of higher refractive index materials, to allow for more facile surface treatment with organosilanes. In this regard, the particles can include species that have a core of one material on which is deposited a material of another type. If used, such nonabsorbing metal oxide and semiconductor particles are preferably included in the photopolymerizable composition in an amount of no greater than 85 wt-%, based on the total weight of the photopolymerizable composition. Preferably, the nonabsorbing metal oxide and semiconductor particles are included in the photopolymerizable composition in an amount of at least 10 wt-%, and more preferably in an amount of at least 45 wt-%, based on the total weight of the photopolymerizable composition. Generally the particles can range in size from 1 nanometer to 1 micron, preferably from 10 nanometers to 300 nanometers, more preferably, from 10 nanometers to 100 nanometers. This particle size is an average particle size, wherein the particle size is the longest dimension of the particles, which is a diameter for spherical particles. It will be appreciated by those skilled in the art that the volume percent of metal oxide and/or semiconductor particles cannot exceed 74 percent by volume given a mono-modal distribution of spherical particles.

Phosphors can optionally be included in the photopolymerizable composition to adjust the color emitted from the LED. As described herein, a phosphor consists of a fluorescent material. The fluorescent material could be inorganic particles, organic particles, or organic molecules or a combination thereof. Suitable inorganic particles include doped garnets (such as YAG:Ce and (Y,Gd)AG:Ce), aluminates (such as $Sr_2Al_{14}O_{25}$:Eu, and BAM:Eu), silicates (such as SrBaSiO: Eu), sulfides (such as ZnS:Ag, CaS:Eu, and $SrGa_2S_4$:Eu), oxy-sulfides, oxy-nitrides, phosphates, borates, and tungstates (such as $CaWO_4$). These materials may be in the form of conventional phosphor powders or nanoparticle phosphor powders. Another class of suitable inorganic particles is the so-called quantum dot phosphors made of semiconductor nanoparticles including Si, Ge, CdS, CdSe, CdTe, ZnS, ZnSe, ZnTe, PbS, PbSe, PbTe, InN, InP, InAs, AlN, AlP, AlAs, GaN, GaP, GaAs and combinations thereof. Generally, the surface of each quantum dot will be at least partially coated with an organic molecule to prevent agglomeration and increase compatibility with the binder. In some cases the semiconductor quantum dot may be made up of several layers of different materials in a core-shell construction. Suitable organic molecules include fluorescent dyes such as those listed in U.S. Pat. No. 6,600,175 (Baretz et al.). Preferred fluorescent materials are those that exhibit good durability and stable optical properties. The phosphor layer may consist of a blend of different types of phosphors in a single layer or a series of layers, each containing one or more types of phosphors. The inorganic phosphor particles in the phosphor layer may vary in size (e.g., diameter) and they may be segregated such that the average particle size is not uniform across the cross-section of the siloxane layer in which they are incorporated. If used, the phosphor particles are preferably included in the photopolymerizable composition in an amount of no greater than 85 wt-%, and in an amount of at least 1 wt-%, based on the total weight of the photopolymerizable composition. The amount of phosphor used will be adjusted according to the thickness of the siloxane layer containing the phosphor and the desired color of the emitted light.

Sensitizers can optionally be included in the photopolymerizable composition to both increase the overall rate of the curing process (or hydrosilylation reaction) at a given wavelength of initiating radiation and/or shift the optimum effective wavelength of the initiating radiation to longer values. Useful sensitizers include, for example, polycyclic aromatic compounds and aromatic compounds containing a ketone chromaphore (such as those disclosed in U.S. Pat. No. 4,916,169 (Boardman et al.) and U.S. Pat. No. 6,376,569 (Oxman et al.)). Examples of useful sensitizers include, but are not limited to, 2-chlorothioxanthone, 9,10-dimethylanthracene, 9,10-dichloroanthracene, and 2-ethyl-9,10-dimethylanthracene. If used, such sensitizers are preferably included in the photopolymerizable composition in an amount of no greater than 50,000 parts by weight, and more preferably no greater than 5000 parts by weight, per one million parts of the composition. If used, such sensitizers are preferably included in the photopolymerizable composition in an amount of at least 50 parts by weight, and more preferably at least 100 parts by weight, per one million parts of the composition.

Photoinitiators can optionally be included in the photopolymerizable composition to increase the overall rate of the curing process (or hydrosilylation reaction). Useful photoinitiators include, for example, monoketals of α-diketones or α-ketoaldehydes and acyloins and their corresponding ethers (such as those disclosed in U.S. Pat. No. 6,376,569 (Oxman et al.)). If used, such photoinitiators are preferably included in the photopolymerizable composition in an amount of no greater than 50,000 parts by weight, and more preferably no greater than 5000 parts by weight, per one million parts of the composition. If used, such photoinitiators are preferably included in the photopolymerizable composition in an amount of at least 50 parts by weight, and more preferably at least 100 parts by weight, per one million parts of the composition.

Catalyst inhibitors can optionally be included in the photopolymerizable composition to further extend the usable shelf life of the composition. Catalyst inhibitors are known in the art and include such materials as acetylenic alcohols (for example, see U.S. Pat. No. 3,989,666 (Niemi) and U.S. Pat. No. 3,445,420 (Kookootsedes et al.)), unsaturated carboxylic esters (for example, see U.S. Pat. No. 4,504,645 (Melancon), U.S. Pat. No. 4,256,870 (Eckberg), U.S. Pat. No. 4,347,346 (Eckberg), and U.S. Pat. No. 4,774,111(Lo)) and certain olefinic siloxanes (for example, see U.S. Pat. No. 3,933,880 (Bergstrom), U.S. Pat. No. 3,989,666 (Niemi), and U.S. Pat. No. 3,989,667 (Lee et al.). If used, such catalyst inhibitors are preferably included in the photopolymerizable composition in an amount up to about ten times the metal-containing catalyst on a mole basis.

The method described herein comprises providing an LED. The LED is a diode that emits light in the visible, ultraviolet, and/or infrared regions. The LED may comprise a single LED such as a monochrome LED, or it may comprise more than one LED. In some cases, it may be useful for the LED to emit light of from 350 to 500 nm, for example, when the actinic radiation is applied by activating the LED itself. The LED includes incoherent epoxy-encased semiconductor devices marketed as "LEDs", whether of the conventional or super-radiant variety. Vertical cavity surface emitting laser diodes are another form of LED. An "LED die" is an LED in its most basic form, i.e., in the form of an individual component or chip made by semiconductor wafer processing procedures. The individual layers and other functional elements of the component or chip are typically formed on the wafer scale, the finished wafer finally being diced into individual piece parts to yield a multiplicity of LED dies. The LED can include electrical contacts suitable for application of power to energize the device.

Any suitable light emitting device may be made according to the method described herein. In one example, the light emitting device is a white light source having a direct emissive configuration of different colored LEDs, e.g., red, green, and blue; or blue and yellow. In another example, the light emitting device may comprise a single LED and a phosphor that is attached or embedded in close proximity to the LED. The LED generates light in a narrow range of wavelengths such that the light impinges upon and excites the phosphor material to produce visible light. The phosphor material can comprise one or a mixture or combination of distinct phosphor materials, and the light emitted by the phosphor material can include a plurality of narrow emission lines distributed over the visible wavelength range such that the emitted light appears substantially white to the unaided human eye. The phosphor material may be applied to the LED as part of the photopolymerizable composition. Alternatively, the phosphor material may be applied to the LED in a separate step, for example, the phosphor may be coated onto the LED prior to contacting the LED with the photopolymerizable composition. An example of a phosphor-LED, or PLED, is a blue LED illuminating a phosphor that converts blue to both red and green wavelengths. A portion of the blue excitation light is not absorbed by the phosphor, and the residual blue excitation light is combined with the red and green light emitted by the phosphor. Another example of a PLED is UV-LED illuminating a phosphor that absorbs and converts UV light to red, green, and blue light. Organopolysiloxanes where the $R^1$ groups are small (as described below) and have minimal UV absorption, for example methyl, are preferred for UV-LEDs. It will be apparent to one skilled in the art that competitive absorption of the actinic radiation by the phosphor will decrease absorption by the photoinitiators or metal-containing catalyst, slowing or even preventing cure if the system is not carefully constructed.

The LED may be packaged in a variety of configurations. For example, the LED may be surface mounted or side mounted in ceramic or polymeric package, which may or may not include a reflecting cup. The LED may also be mounted on circuit board or on a plastic electronic substrate.

The method disclosed herein utilizes organosiloxane compositions that are cured by metal-catalyzed hydrosilylation reactions between groups incorporating aliphatic unsaturation and silicon-bonded hydrogen, which are bonded to the organosiloxane components. The combination of the first and second metal-containing catalysts provides: (1) the ability to cure the photopolymerizable composition without subjecting the LED, the substrate to which it is attached, or any other materials present in the package or system, to potentially harmful levels of actinic radiation and/or hightemperatures, (2) the ability to formulate one-part photopolymerizable compositions that display long working times (also known as bath life or shelf life), (3) the ability to form the encapsulant on demand at the discretion of the user.

Actinic radiation may be applied to any one of a photopolymerizable composition, a partially polymerized composition, a second partially polymerized composition, a substantially polymerized composition, etc. as described in the methods disclosed herein. In general, actinic radiation is used to activate the first metal-containing catalyst such that hydrosilylation within the silicon-containing resin is initiated (or further initiated as described below). Actinic radiation may be applied until the desired properties are obtained. For example, actinic radiation may be applied until a qualitatively tack free, elastomeric composition is formed, or until a qualitatively tacky gel is formed. The latter may be desirable in order to control settling of any additional components such as particles, phosphors, etc. which may be present.

The actinic radiation typically has a wavelength of less than or equal to 700 nm, including visible and UV light, but preferably, it is 600 nm or less, from 200 to 600 nm, or from 250 to 500 nm. Preferably, the actinic radiation has a wavelength of at least 200 nm, and more preferably at least 250 nm. Examples of sources of actinic radiation include tungsten halogen lamps, xenon arc lamps, mercury arc lamps, incandescent lamps, germicidal lamps, and fluorescent lamps. In certain embodiments, the source of actinic radiation is the LED.

Heat may be applied to any one of the photopolymerizable composition, the partially polymerized composition, the substantially polymerized composition, etc. as described in the methods disclosed herein. Heat may be applied at the same time that actinic radiation is applied, for example, when it is desirable to accelerate the hydrosilylation reaction, or to decrease the amount of time the composition is exposed to the actinic radiation. As described above, heat may be applied until the desired properties are obtained, i.e., until a qualitatively tack free, elastomeric composition is formed, or until a qualitatively tacky gel is formed. Heat applied during application of actinic radiation may be at temperature of less than 120° C., more preferably, at a temperature of less than 60° C., and still more preferably, at a temperature of 25° C. or less.

Heat may be applied to a given composition before the mold is applied in order to reduce the viscosity of the composition and facilitate contact between the composition and the mold. Heat may also be applied to activate the second metal-containing catalyst typically in a separate step as described below. Heat applied to activate the second metal-containing catalyst may be less than 150° C., or more preferably at less than 100° C., and still more preferably at less than 60° C. Any heating means may be used such as an infrared lamp, a forced air oven, or a heating plate.

Methods of employing two different catalysts, one activated with actinic radiation and the other with heat, for the purpose of making silicon-containing encapsulants are described in U.S. patent application Ser. Nos. 11/255711 and 11/255712. Basically, at any time during a given sequence of steps to form an encapsulant, the mold may be applied, as long as the composition is capable of being molded and can suffiently contact, or wet, the mold.

After contacting with the mold, actinic radiation may be applied to the photopolymerizable composition to form a partially polymerized composition or a substantially polymerized composition. At a later time, hydrosilylation may be further intiated by applying heat to the composition in order to increase the extent to which hydrosilylation takes place. For example, actinic radiation may be applied to form a partially polymerized composition, and at a later time, heat may be applied to form the encapsulant. Another option is to heat the polymerizable composition after contacting it with the mold, such that the encapsulant is formed. In this case, the first metal-containing catalyst would not be activated.

Actinic radiation may be applied to the photopolymerizable composition before contacting it with the mold. This method comprises: providing a light emitting diode; contacting the light emitting diode with a photopolymerizable composition comprising: a silicon-containing resin comprising silicon-bonded hydrogen and aliphatic unsaturation, a first metal-containing catalyst that may be activated by actinic radiation, and a second metal-containing catalyst that may be activated by heat but not the actinic radiation; and applying actinic radiation to the photopolymerizable composition, wherein the actinic radiation is at a wavelength of 700 nm or less and initiates hydrosilylation within the silicon-containing resin, thereby forming a partially polymerized composition, the hydrosilylation comprising reaction between the silicon-bonded hydrogen and the aliphatic unsaturation; and contacting the partially polymerized composition with a mold. Then, actinic radiation and/or heat may be applied to the partially polymerized composition after contacting it with the mold to further initiate hydrosilylation within the silicon-containing resin.

Heat may be applied to the photopolymerizable composition before contacting it with the mold. This method comprises: providing a light emitting diode; contacting the light emitting diode with a photopolymerizable composition comprising: a silicon-containing resin comprising silicon-bonded hydrogen and aliphatic unsaturation, a first metal-containing catalyst that may be activated by actinic radiation, and a second metal-containing catalyst that may be activated by heat but not the actinic radiation; and heating the photopolymerizable composition to a temperature of less than about 150° C. to initiate hydrosilylation within the silicon-containing resin, thereby forming a partially polymerized composition, the hydrosilylation comprising reaction between the silicon-bonded hydrogen and the aliphatic unsaturation; and contacting the partially polymerized composition with a mold. Then, actinic radiation and/or heat may be applied to the partially polymerized composition after contacting it with the mold to further initiate hydrosilylation within the silicon-containing resin.

EXAMPLES

Mounting Blue LED Die In a Ceramic Package

Into a Kyocera package (Kyocera America, Inc., Part No. KD-LA2707-A) is bonded a Cree XB die (Cree Inc., Part No. C460XB290-0103-A) using a water based halide flux (Superior No. 30, Superior Flux & Mfg. Co.). The LED device is completed by wire bonding (Kulicke and Soffa Industries, Inc. 4524 Digital Series Manual Wire Bonder) the Cree XB die using 1 mil gold wire. The peak emission wavelength of the LED is 455-457 nm.

Example 1

To 10.00 g of $H_2C=CH-Si(CH_3)_2O-[Si(CH_3)_2O]_{80}-[Si(C_6H_5)_2O]_{26}-Si(CH_3)_2-CH=CH_2$ (available from Gelest as PDV-2331) is added a 25 μL aliquot of a solution of 10 mg of $Pt\{[H_2C=CH-Si(CH_3)_2]O\}_2$ in 10 mL of heptane. To 1.00 g of this composition is added an additional 1.50 g of PDV-2331, 0.26 g of $H(CH_3)_2SiO-[Si(CH_3)HO]_{15}-[Si(CH_3)(C_6H_5)O]_{15}-Si(CH_3)_2H$ (available from Gelest as HPM-502), and a 25 μL aliquot of a solution of 33 mg of CH₃CpPt(CH₃)₃ (from Strem Chemicals) in 1 mL of toluene. The mixture is degassed under vacuum, and the final composition was labeled Encapsulant A.

A small drop of Encapsulant A is placed into a blue LED device described above using the tip of a syringe needle such that the LED and wire bond are covered and the device is filled to level to the top of the reflector cup. The siloxane encapsulant is irradiated for 1 minute under a UVP Blak-Ray Lamp Model XX-15 fitted with two 16-inch Philips F15T8/BL 15 W bulbs emitting at 365 nm from a distance of 20 mm from the encapsulated LED. A piece of brightness enhancement film (BEF II) available from 3M is pressed into the partially cured encapsulant. The partially cured encapsulant is then irradiated for a further 5 minutes. The BEF film is peeled off the encapsulant. Examination of the light emitting device using a microscope shows a series of prisms on the surface of the encapsulant.

Example 2

A blue LED device is filled with Encapsulant A as described in Example 1. The siloxane encapsulant is irradiated as described in Example 1 for 1 minute. A piece of BEF film is pressed into the partially cured encapsulant. The LED device containing the irradiated encapsulant is then placed on a hotplate set at 100° C. for 30 seconds. The BEF film is peeled off the encapsulant. Examination of the light emitting device using a microscope shows a series of prisms on the surface of the encapsulant.

Various modifications and alterations to the invention will become apparent to those skilled in the art without departing from the scope and spirit of the invention.

What is claimed is:

1. A light emitting device comprising:
   a light emitting diode;
   a photopolymerizable composition comprising:
      a silicon-containing resin comprising silicon-bonded hydrogen and aliphatic unsaturation, and
      a first metal-containing catalyst that may be activated by actinic radiation, and
      a second metal-containing catalyst that may be activated by heat but not the actinic radiation; and
   a mold.

2. The light emitting device of claim 1, wherein the photopolymerizable composition is at least partially polymerized.

3. A light emitting device comprising:
   a light emitting diode;
   an at least partially polymerized composition in contact with the light emitting diode and formed from a photopolymerizable composition comprising:
      a silicon-containing resin comprising silicon-bonded hydrogen and aliphatic unsaturation,
      a first metal-containing catalyst that may be activated by actinic radiation, and
      a second metal-containing catalyst that may be activated by heat but not the actinic radiation; and
   wherein a surface of the at least partially polymerized composition is shaped as a positive or negative lens on a substantial portion thereof.

4. A light emitting device comprising:
   a light emitting diode;
   an at least partially polymerized composition in contact with the light emitting diode and formed from a photopolymerizable composition comprising:
      a silicon-containing resin comprising silicon-bonded hydrogen and aliphatic unsaturation,
      a first metal-containing catalyst that may be activated by actinic radiation, and
      a second metal-containing catalyst that may be activated by heat but not the actinic radiation; and
   wherein a surface of the at least partially polymerized composition is shaped with macrostructures, each macrostructure having a dimension of from 10 um to 1 mm.

5. A light emitting device comprising:
   a light emitting diode;
   an at least partially polymerized composition in contact with the light emitting diode and formed from a photopolymerizable composition comprising:
      a silicon-containing resin comprising silicon-bonded hydrogen and aliphatic unsaturation,
      a first metal-containing catalyst that may be activated by actinic radiation, and
      a second metal-containing catalyst that may be activated by heat but not the actinic radiation; and
   wherein a surface of the at least partially polymerized composition is shaped with microstructures, each microstructure having a dimension of from 100 nm to less than 10 um.

6. A method of making a light emitting device, the method comprising:
   providing a light emitting diode;
   contacting the light emitting diode with a photopolymerizable composition comprising:
      a silicon-containing resin comprising silicon-bonded hydrogen and aliphatic unsaturation,
      a first metal-containing catalyst that may be activated by actinic radiation, and
      a second metal-containing catalyst that may be activated by heat but not the actinic radiation; and
   contacting the photopolymerizable composition with a mold.

7. The method of claim 6, further comprising:
   applying actinic radiation to the photopolymerizable composition after contacting it with the mold, wherein the actinic radiation is at a wavelength of 700 nm or less and initiates hydrosilylation within the silicon-containing resin, the hydrosilylation comprising reaction between the silicon-bonded hydrogen and the aliphatic unsaturation.

8. The method of claim 6, further comprising:
   heating the photopolymerizable composition to a temperature of less than about 150° C. after contacting it with the mold, wherein heating initiates hydrosilylation within the silicon-containing resin, the hydrosilylation comprising reaction between the silicon-bonded hydrogen and the aliphatic unsaturation.

9. The method of claim 6, further comprising:
   applying actinic radiation to the photopolymerizable composition after contacting it with the mold, wherein the actinic radiation is at a wavelength of 700 nm or less and initiates hydrosilylation within the silicon-containing resin, thereby forming a partially polymerized composition, the hydrosilylation comprising reaction between the silicon-bonded hydrogen and the aliphatic unsaturation; and
   heating the partially polymerized composition to a temperature of less than about 150° C. to further initiate hydrosilylation.

10. A method of making a light emitting device, the method comprising:

providing a light emitting diode;
contacting the light emitting diode with a photopolymerizable composition comprising:
   a silicon-containing resin comprising silicon-bonded hydrogen and aliphatic unsaturation,
   a first metal-containing catalyst that may be activated by actinic radiation, and
   a second metal-containing catalyst that may be activated by heat but not the actinic radiation; and
applying actinic radiation to the photopolymerizable composition, wherein the actinic radiation is at a wavelength of 700 nm or less and initiates hydrosilylation within the silicon-containing resin, thereby forming a partially polymerized composition, the hydrosilylation comprising reaction between the silicon-bonded hydrogen and the aliphatic unsaturation; and
contacting the partially polymerized composition with a mold.

11. The method of claim 10, further comprising:
applying actinic radiation to the partially polymerized composition after contacting it with the mold, wherein the actinic radiation applied to the partially polymerized composition is at a wavelength of 700 nm or less and further initiates hydrosilylation within the silicon-containing resin.

12. The method of claim 10, further comprising:
heating the partially polymerized composition to a temperature of less than about 150° C. after contacting it with the mold, wherein heating further initiates hydrosilylation within the silicon-containing resin.

13. A method of making a light emitting device, the method comprising:
providing a light emitting diode;
contacting the light emitting diode with a photopolymerizable composition comprising:
   a silicon-containing resin comprising silicon-bonded hydrogen and aliphatic unsaturation,
   a first metal-containing catalyst that may be activated by actinic radiation, and
   a second metal-containing catalyst that may be activated by heat but not the actinic radiation; and
heating the photopolymerizable composition to a temperature of less than about 150° C. to initiate hydrosilylation within the silicon-containing resin, thereby forming a partially polymerized composition, the hydrosilylation comprising reaction between the silicon-bonded hydrogen and the aliphatic unsaturation; and
contacting the partially polymerized composition with a mold.

14. The method of claim 13, further comprising:
applying actinic radiation to the partially polymerized composition, wherein the actinic radiation is at a wavelength of 700 nm or less and further initiates hydrosilylation within the silicon-containing resin.

15. The method of claim 13, further comprising:
heating the partially polymerized composition to a temperature of less than about 150° C. to further initiate hydrosilylation within the silicon-containing resin.

16. The method as in any one of claims 6, 10 and 13, wherein the mold is transparent to the actinic radiation.

17. The method as in any one of claims 7, 9, 10, 11 and 14, wherein applying actinic radiation comprises activating the light emitting diode.

18. The method of claim 6, the mold comprising a mold material and being shaped to impart a positive or negative lens on a substantial portion of the surface of the photopolymerizable composition.

19. The method of claim 6, the mold comprising a mold material and being shaped to impart macrostructures, each macrostructure having a dimension of from 10 um to 1 mm.

20. The method of claim 6, the mold comprising a mold material and being shaped to impart microstructures, each microstructure having a dimension of from 100 nm to less than 10 um.

21. A method of making a light emitting device, the method comprising:
providing a light emitting diode;
contacting the light emitting diode with a photopolymerizable composition comprising:
   a silicon-containing resin comprising silicon-bonded hydrogen and aliphatic unsaturation,
   a first metal-containing catalyst that may be activated by actinic radiation, and
   a second metal-containing catalyst that may be activated by heat but not the actinic radiation;
shaping a surface of the photopolymerizable composition by contacting it with a mold;
applying actinic radiation to the photopolymerizable composition to form an at least partially polymerized composition, wherein the actinic radiation is at a wavelength of 700 nm or less and initiates hydrosilylation within the silicon-containing resin, the hydrosilylation comprising reaction between the silicon-bonded hydrogen and the aliphatic unsaturation;
separating the mold from the at least partially polymerized composition.

22. A light emitting device prepared according to the method of claim 21.

23. A method of making a light emitting device, the method comprising:
providing a light emitting diode;
contacting the light emitting diode with a photopolymerizable composition comprising:
   a silicon-containing resin comprising silicon-bonded hydrogen and aliphatic unsaturation,
   a first metal-containing catalyst that may be activated by actinic radiation, and
   a second metal-containing catalyst that may be activated by heat but not the actinic radiation;
shaping a surface of the photopolymerizable composition by contacting it with a mold;
heating the photopolymerizable composition to a temperature of less than about 150° C. to form an at least partially polymerized composition, wherein heating initiates hydrosilylation within the silicon-containing resin, the hydrosilylation comprising reaction between the silicon-bonded hydrogen and the aliphatic unsaturation;
separating the mold from the at least partially polymerized composition.

24. A light emitting device prepared according to the method of claim 23.

25. A method of making a light emitting device, the method comprising:
providing a light emitting diode;
contacting the light emitting diode with a photopolymerizable composition comprising:
   a silicon-containing resin comprising silicon-bonded hydrogen and aliphatic unsaturation,
   a first metal-containing catalyst that may be activated by actinic radiation, and
   a second metal-containing catalyst that may be activated by heat but not the actinic radiation;
applying actinic radiation to the photopolymerizable composition to form an at least partially polymerized composition, wherein the actinic radiation is at a wavelength of 700 nm or less and initiates hydrosilylation within the silicon-containing resin, the hydrosilylation comprising reaction between the silicon-bonded hydrogen and the aliphatic unsaturation;

shaping a surface of the at least partially polymerized composition by contacting it with a mold;

further initiating hydrosilylation within the silicon-containing resin of the partially polymerized composition by:
  applying actinic radiation is at a wavelength of 700 nm or less, or
  heating to a temperature of less than about 150° C.; and
separating the mold from the polymerized composition.

26. A light emitting device prepared according to the method of claim 25.

27. A method of making a light emitting device, the method comprising:
providing a light emitting diode;
contacting the light emitting diode with a photopolymerizable composition comprising:
  a silicon-containing resin comprising silicon-bonded hydrogen and aliphatic unsaturation,
  a first metal-containing catalyst that may be activated by actinic radiation, and
  a second metal-containing catalyst that may be activated by heat but not the actinic radiation;
heating the photopolymerizable composition to a temperature of less than about 150° C. to initiate hydrosilylation within the silicon-containing resin, thereby forming a partially polymerized composition, the hydrosilylation comprising reaction between the silicon-bonded hydrogen and the aliphatic unsaturation;
shaping a surface of the at least partially polymerized composition by contacting it with a mold;
further initiating hydrosilylation within the silicon-containing resin of the partially polymerized composition by:
  applying actinic radiation is at a wavelength of 700 nm or less, or
  heating to a temperature of less than about 150° C.; and
separating the mold from the polymerized composition.

28. A light emitting device prepared according to the method of claim 27.

* * * * *